US009029210B2

(12) United States Patent
Nie et al.

(10) Patent No.: US 9,029,210 B2
(45) Date of Patent: May 12, 2015

(54) GAN VERTICAL SUPERJUNCTION DEVICE STRUCTURES AND FABRICATION METHODS

(71) Applicant: AVOGY, INC., San Jose, CA (US)

(72) Inventors: Hui Nie, Cupertino, CA (US); Andrew P. Edwards, San Jose, CA (US); Donald R. Disney, Cupertino, CA (US); Isik C. Kizilyalli, San Francisco, CA (US)

(73) Assignee: AVOGY, INC., San Jose, CA (US)

( * ) Notice: Subject to any disclaimer, the term of this patent is extended or adjusted under 35 U.S.C. 154(b) by 0 days.

(21) Appl. No.: 14/302,270

(22) Filed: Jun. 11, 2014

(65) Prior Publication Data

US 2014/0295652 A1 Oct. 2, 2014

Related U.S. Application Data

(62) Division of application No. 13/529,822, filed on Jun. 21, 2012, now Pat. No. 8,785,975.

(51) Int. Cl.
*H01L 21/02* (2006.01)
*H01L 21/8252* (2006.01)
*H01L 27/06* (2006.01)
*H01L 29/778* (2006.01)
*H01L 29/06* (2006.01)

(52) U.S. Cl.
CPC ........ *H01L 21/0254* (2013.01); *H01L 21/8252* (2013.01); *H01L 27/0605* (2013.01); *H01L 29/0657* (2013.01); *H01L 29/7786* (2013.01); *H01L 21/02664* (2013.01); *Y10S 438/978* (2013.01)

(58) Field of Classification Search
USPC .................................................. 438/192, 978
See application file for complete search history.

(56) References Cited

U.S. PATENT DOCUMENTS

| | | | |
|---|---|---|---|
| 6,855,981 B2 | 2/2005 | Kumar et al. | |
| 7,211,822 B2 | 5/2007 | Nagahama et al. | |
| 7,233,028 B2 | 6/2007 | Weeks et al. | |
| 8,044,434 B2 | 10/2011 | Ohta et al. | |
| 8,134,180 B2 | 3/2012 | Otake et al. | |
| 8,169,022 B2 | 5/2012 | Cheng et al. | |
| 2008/0274621 A1 | 11/2008 | Beach et al. | |
| 2010/0078688 A1 | 4/2010 | Otake et al. | |
| 2011/0127586 A1* | 6/2011 | Bobde et al. | 257/262 |

* cited by examiner

*Primary Examiner* — Eugene Lee
(74) *Attorney, Agent, or Firm* — Kilpatrick Townsend & Stockton LLP

(57) ABSTRACT

A semiconductor device includes a III-nitride substrate of a first conductivity type, a first III-nitride epitaxial layer of the first conductivity type coupled to the III-nitride substrate, and a first III-nitride epitaxial structure coupled to a first portion of a surface of the first III-nitride epitaxial layer. The first III-nitride epitaxial structure has a sidewall. The semiconductor device further includes a second III-nitride epitaxial structure of the first conductivity type coupled to the first III-nitride epitaxial structure, a second III-nitride epitaxial layer of the first conductivity type coupled to the sidewall of the second III-nitride epitaxial layer and a second portion of the surface of the first III-nitride epitaxial layer, and a third III-nitride epitaxial layer of a second conductivity type coupled to the second III-nitride epitaxial layer. The semiconductor device also includes one or more dielectric structures coupled to a surface of the third III-nitride epitaxial layer.

9 Claims, 17 Drawing Sheets

GAN VERTICAL SUPERJUNCTION DEVICE STRUCTURES AND FABRICATION METHODS

CROSS-REFERENCES TO RELATED APPLICATION

This patent application is a divisional of U.S. patent application Ser. No. 13/529,822, filed Jun. 21, 2012, entitled, "GAN VERTICAL SUPERJUNCTION DEVICE STRUCTURES AND FABRICATION METHODS," which is incorporated by reference in its entirety herein for all purposes.

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to forming vertical superjunction devices. Merely by way of example, the invention has been applied to methods and systems for manufacturing vertical junction field-effect transistors (JFETs) and diodes using gallium-nitride (GaN) based epitaxial layers. The methods and techniques can be applied to a variety of compound semiconductor systems, such as other transistor types, which can provide either normally-off or normally-on functionality.

According to one embodiment of the present invention, a method for fabricating a vertical superjunction device is provided. The method includes providing a III-nitride substrate of a first conductivity type, forming a first III-nitride epitaxial layer of the first conductivity type coupled to the III-nitride substrate, and forming a second III-nitride epitaxial layer coupled to the first III-nitride epitaxial layer. The method further includes forming a third III-nitride epitaxial layer of the first conductivity type coupled to the second III-nitride epitaxial layer, removing a portion of the third III-nitride epitaxial layer and a portion of the second III-nitride epitaxial layer to expose a sidewall of the second III-nitride epitaxial layer and an exposed surface of the first III-nitride epitaxial layer, and forming a masking material coupled to a surface of a remaining portion of the third III-nitride epitaxial layer. Additionally, the method includes forming a fourth III-nitride epitaxial layer of the first conductivity type coupled to the sidewall of the second III-nitride epitaxial layer and the exposed surface of the first III-nitride epitaxial layer, forming a fifth III-nitride epitaxial layer of a second conductivity type coupled to the fourth III-nitride epitaxial layer, and removing at least a portion of the masking material to expose the surface of the remaining portion of the third III-nitride epitaxial layer, a surface of the fourth III-nitride epitaxial layer, and a surface of the fifth III-nitride epitaxial layer. Finally, the method includes forming one or more insulating structures coupled to the fifth III-nitride epitaxial layer.

According to another embodiment of the present invention, a semiconductor device includes a III-nitride substrate of a first conductivity type, a first III-nitride epitaxial layer of the first conductivity type coupled to the III-nitride substrate, and a first III-nitride epitaxial structure coupled to a first portion of a surface of the first III-nitride epitaxial layer. The first III-nitride epitaxial structure has a sidewall. The semiconductor device further includes a second III-nitride epitaxial structure of the first conductivity type coupled to the first III-nitride epitaxial structure, a second III-nitride epitaxial layer of the first conductivity type coupled to the sidewall of the second III-nitride epitaxial layer and a second portion of the surface of the first III-nitride epitaxial layer, and a third III-nitride epitaxial layer of a second conductivity type coupled to the second III-nitride epitaxial layer. The semiconductor device also includes one or more dielectric structures coupled to a surface of the third III-nitride epitaxial layer.

According to yet another embodiment of the present invention, a vertical superjunction gate field-effect transistor structure is provided. The vertical superjunction gate field-effect transistor structure includes a substrate comprising a III-nitride material of a first conductivity type, a current blocking region coupled to the substrate and comprising a III-nitride epitaxial material, and a source region coupled to the current blocking region and comprising a III-nitride epitaxial material of the first conductivity type. The vertical superjunction gate field-effect transistor structure further includes a first metal contact structure coupled to the source region, and a substantially charge-balanced region adjacent to the current blocking region. The substantially charge-balanced region includes a layer of III-nitride epitaxial material of the first conductivity type, and a layer of III-nitride epitaxial material of a second conductivity type. The substantially charge-balanced region is configured to conduct a current when the transistor structure is under forward-bias conditions. The vertical superjunction gate field-effect transistor structure also includes one or more dielectric structures coupled to at least a portion of the substantially charge-balanced region, and a second metal contact structure coupled to at least a portion of the one or more dielectrice structures and at least a portion of the substantially charge-balanced region.

Numerous benefits are achieved by way of the present invention over conventional techniques. For example, embodiments of the present invention enable the manufacture of vertical superjunction devices having significantly less on resistance ($R_{on}$) than corresponding non-superjunction devices at the same breakdown voltage rating. Furthermore, the usage of gallium-nitride (GaN) based epitaxial layers and similar III-nitride materials having high electron mobility and other desirable characteristics allows for the manufacture of superjunction devices having significantly smaller dimensions and/or less resistive characteristics than similar devices fabricated with other materials. These and other embodiments of the invention, along with many of its advantages and features, are described in more detail in conjunction with the text below and attached figures.

Figure 1:
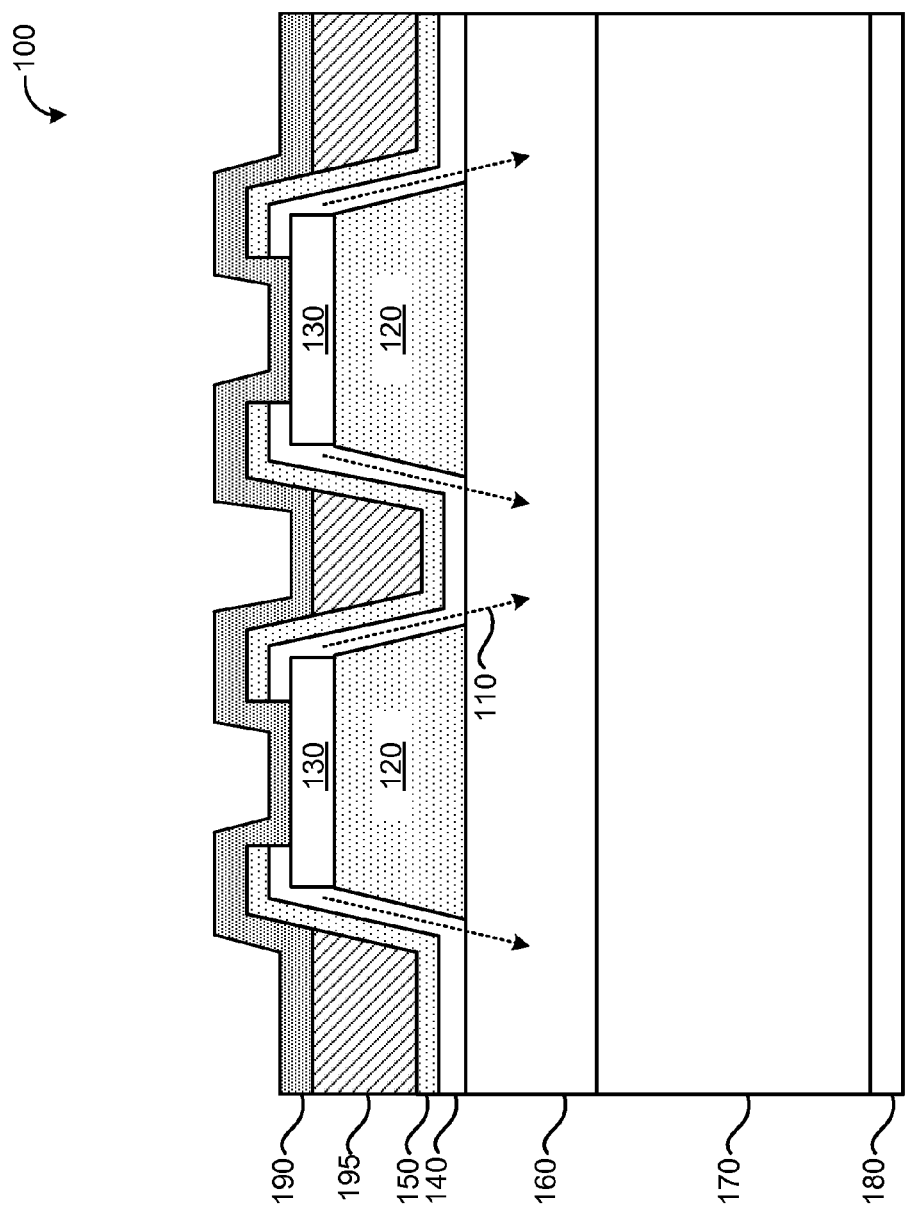
FIG. 1 is a simplified cross-sectional diagram of a vertical superjunction diode according to one embodiment.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

The present invention relates generally to electronic devices. More specifically, the present invention relates to forming vertical superjunction devices. Merely by way of example, the invention has been applied to methods and systems for manufacturing vertical junction field-effect transistors (JFETs) and diodes using gallium-nitride (GaN) based epitaxial layers. The methods and techniques can be applied to a variety of compound semiconductor systems, such as other transistor types (e.g., metal-oxide-semiconductor field-effect transistors (MOSFETs) and bipolar transistors (BJTs, HBTs)).

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on pseudobulk GaN substrates is utilized to fabricate vertical GaN-based semiconductor devices not possible using conventional techniques. For example, conventional methods of growing GaN include using a foreign substrate such as silicon carbide (SiC), sapphire, and silicon. This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create vertical devices, including power electronic devices such as JFETs and other field-effect transistors.

Homoepitaxial GaN layers on bulk GaN substrates, on the other hand, can be utilized in the embodiments described herein to provide superior properties to conventional techniques and devices. For instance, electron mobility, μ, is higher for a given background doping level, N. This provides low resistivity, ρ, because resistivity is inversely proportional to electron mobility, as provided by equation (1):

$$\rho = \frac{1}{q\mu N}, \tag{1}$$

where q is the elementary charge.

Another superior property provided by homoepitaxial GaN layers on bulk GaN substrates is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \tag{2}$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

Superjunction devices utilize one or more pairs of n-type and p-type semiconductor layers that are approximately charge balanced (i.e., the net doping in both layers is approximately equal), such the charge-balanced layer pair functions similarly as an intrinsic layer upon depletion and conducts current in forward bias, resulting in high breakdown voltage and low on resistance. The favorable characteristics of GaN enable the creation of superjunction devices having far better device characteristics (e.g., higher voltage, lower resistance, etc.) and/or smaller device features. In some implementations, for example, devices features can be up to 10 times smaller, or more, as corresponding features fabricated with other materials, while maintaining a similar on resistance.

In addition to the ability to support high-voltage, low-resistance vertical superjunction applications, the GaN vertical superjunction devices described herein can differ from traditional vertical JFETs in other ways. For example, other semiconductors used to manufacture vertical devices such as SiC can be utilized, altering the mode of manufacture. Furthermore, the use of GaN epitaxial layers can allow for non-uniform dopant concentrations as a function of thickness within the various layers of the vertical superjunction devices, which can optimize the performance of the device.

FIG. 1 is a simplified cross-sectional diagram of an embodiment of a vertical superjunction diode 100, illustrating how the charge-balanced p-type and n-type semiconductor layers discussed herein can provide functionality to improve the performance of the vertical superjunction diode 100, as well as other semiconductor devices. In the superjunction diode 100, an intrinsic region 120 (which also can be an p-type epitaxial layer) separate n-type epitaxial layer from an n-type drift region 160 and an n+ substrate 170. Metal contacts 190 and 180 are provided as electrodes to the terminals of the superjunction diode 100. In this configuration, electrodes 180 and 190 are isolated from each other due to intrinsic layer 120.

In contrast to typical diode structures, the superjunction diode 100 also includes an n-type layer 140 and p-type layer 150 adjacent to the n− epitaxial layer 130 and an intrinsic region 120, and electrically coupled with the metal contact

190. The product of width and doping of these semiconductor layers 140, 150 is such that they are approximately charged balanced. A dielectric material such as an oxide, a nitride or other suitable insulator 195 is provided between at least a portion of the metal contact 190 and at least a portion of the approximately charge-balanced semiconductor layers 140, 150 to allow a portion of the charge-balanced semiconductor layers 140, 150 to form a depletion region under no bias or reverse bias (i.e., jointly behave as an intrinsic region). However, under forward-bias conditions, the n-type layer 140 provides a low-resistance current path 110 to the drift region 160, giving the superjunction diode 100 lower on-resistance than other diode types. Since semiconductor layers 140 and 150 are approximately charge balanced, it appears to be intrinsic when diode is under reverse bias conditions. Compared to typical unipolar diode with doped drift layer, superjunction diode can operate at higher reverse bias at the same diode depletion width. In other words, superjunction will have less drift layer or high doping in current conducting layer compared to typical unipolar diode at the same voltage rating. In some embodiment, the drift layer 160 can be omitted or minimized so that current conducting layer 140 is directly coupled to substrate 170.

Figure 2:
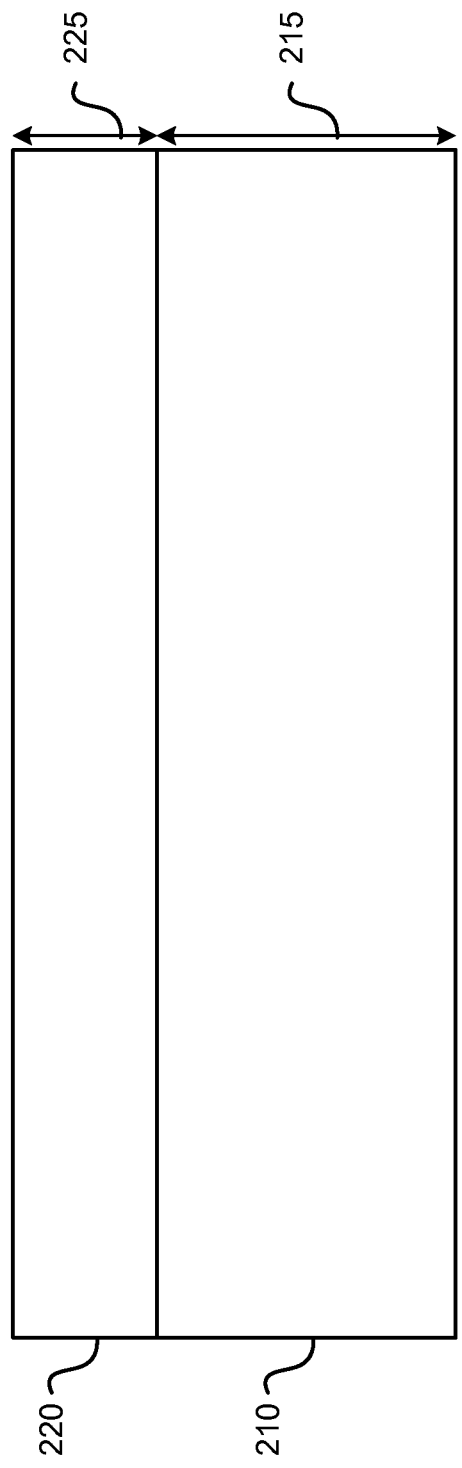
FIGS. 2-11 are simplified cross-sectional diagrams illustrating the fabrication of a vertical superjunction diode according to an embodiment of the present invention.

The manufacture of vertical superjunction devices in GaN and other III-nitride materials can be carried out in a variety of ways. FIGS. 2-9 illustrate a particular embodiment of a process for creating a vertical superjunction diode. Although the figures include more than one vertical superjunction diode, the process described can refer to the manufacture of a single and/or isolated superjunction diode. Referring to FIG. 2, a first GaN epitaxial layer 220 is formed on a GaN substrate 210. The GaN substrate 210 can be a pseudo-bulk GaN material on which the first GaN epitaxial layer 220 is grown. Dopant concentrations (e.g., doping density) of the GaN substrate 210 can vary. For example, a GaN substrate 210 can have an n+ conductivity type, with dopant concentrations ranging from $1\times10^{17}$ cm$^{-3}$ to $1\times10^{19}$ cm$^{-3}$. The thickness 215 of the GaN substrate 210 also can vary. Embodiments contemplate thicknesses ranging from 0.5 μm to 500 μm. Although the GaN substrate 210 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 220 can also vary, depending on desired functionality. The first GaN epitaxial layer 220 can serve as part of the drift region for the vertical superjunction diode, and therefore can be a relatively low-doped material. In some embodiments, the dopant concentration of the first GaN epitaxial layer 220 is lower than the dopant concentration of the GaN substrate 210. For example, the first GaN epitaxial layer 220 can have an n− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region and/or channel. In some embodiments, the first GaN epitaxial layer 220 can comprise two or more sublayers, which can have differing physical characteristics (e.g., dopant concentrations, dopant uniformity, etc.)

The thickness 225 of the first GaN epitaxial layer 220 can also vary substantially, depending on the desired functionality. As discussed above, homoepitaxial growth can enable the first GaN epitaxial layer 220 to be grown far thicker than layers formed using conventional methods. For example, in some embodiments, thicknesses can vary between 0 μm to 100 μm or more. Resulting breakdown voltages for the vertical superjunction diode can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, or the like. P-type dopants can include magnesium, beryllium, zinc, or the like.

Figure 3:
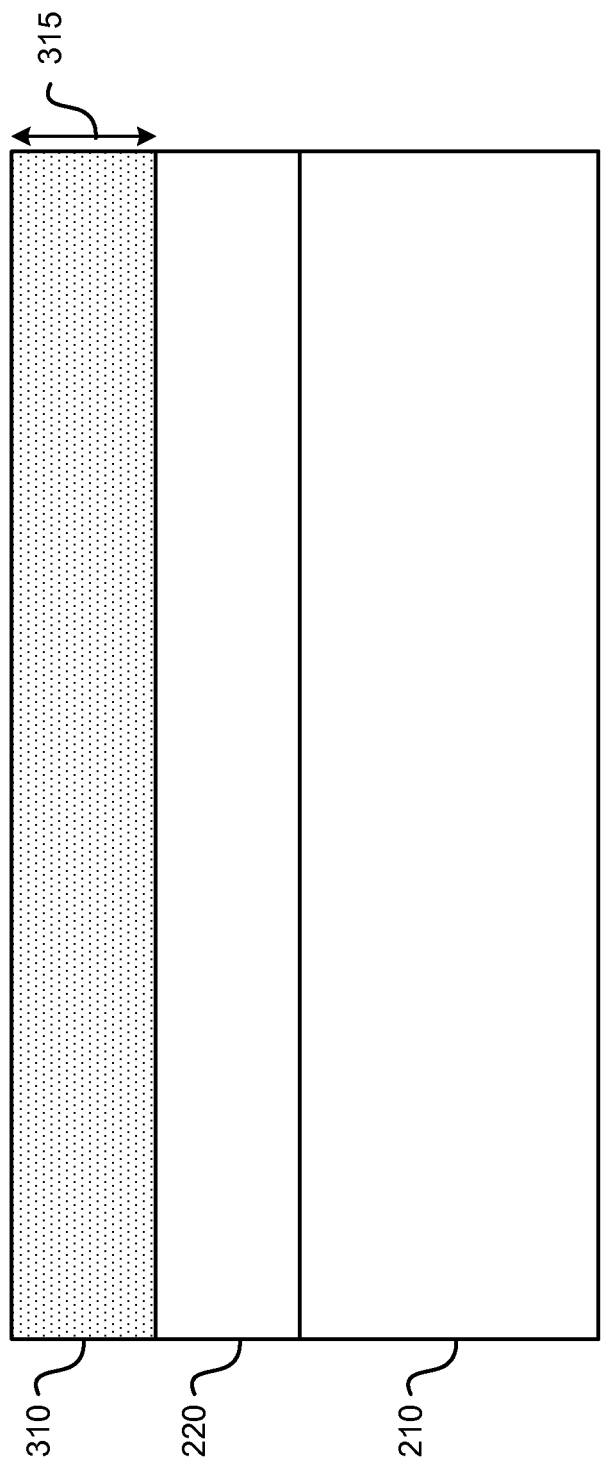

Referring to FIG. 3, a second GaN epitaxial layer 310 is provided, which can be coupled to the first GaN epitaxial layer 220. The second GaN epitaxial layer 310, which eventually can be used to form epitaxial structures providing physical support for the superjunction, can be a low-doped, substantially undoped, or unintentionally doped epitaxial layer. The second GaN epitaxial layer 310 therefore can have an intrinsic conductivity, or may be a low-doped epitaxial layer of the opposite conductivity type as the first GaN epitaxial layer 220 and the GaN substrate 210. For example, if the GaN substrate 210 has n-type conductivity, the second GaN epitaxial layer 310 can have an p− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the intrinsic region.

The thickness 315 of the second GaN epitaxial layer 310 can impact, among other things, the length of the current path when the vertical superjunction diode is operating under forward-bias conditions. In some embodiments, thicknesses can be between 0.2 μm and 50 μm, for example 6 μm.

Figure 4:
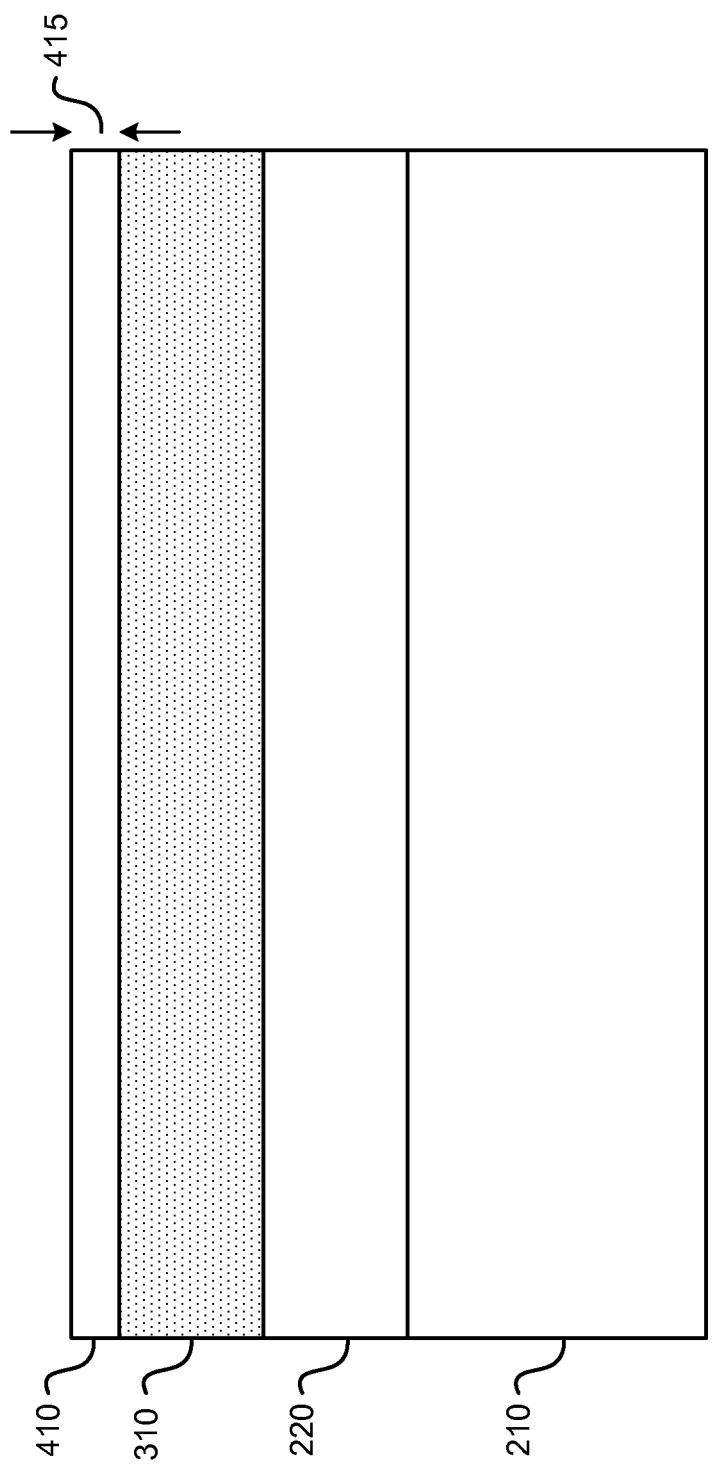

FIG. 4 illustrates the formation of a third GaN epitaxial layer 410 coupled to the second GaN epitaxial layer 310. The third GaN epitaxial layer 410 may have the same conductivity type as the GaN substrate 210. In certain embodiments, for instance, the GaN substrate 210 and the third GaN epitaxial layer 410 are formed from n-type GaN material.

The thickness 415 of the third GaN epitaxial layer 410 can vary, depending on the process used to form the layer and the desired functionality of the vertical superjunction diode. In some embodiments, the thickness of the third GaN epitaxial layer 410 may be between 0.1 μm and 1 μm.

The third GaN epitaxial layer 410 can be formed from low-doped GaN, for example between about $1\times10^{15}$ cm$^{-3}$ to about $1\times10^{19z}$ cm$^{-3}$. In some embodiments, doping is selected so that metal contacts can be Schottky contact or even Ohmic contact. Additionally, as with other epitaxial layers, the dopant concentration of the third GaN epitaxial layer 410 can be uniform or non-uniform as a function of thickness. In some embodiments, the dopant concentration increases with thickness, such that the dopant concentration is relatively low near the second GaN epitaxial layer 220 and increases as the distance from the second GaN epitaxial layer 220 increases. Such embodiments provide higher dopant concentrations at the top of the third GaN epitaxial layer 410 where metal contacts can be subsequently formed (in embodiments where, for example, ohmic metal contacts are desired). Other embodiments may utilize heavily doped contact layers (not shown) to form contacts.

One method of forming the epitaxial layers described herein can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety.

Figure 5:
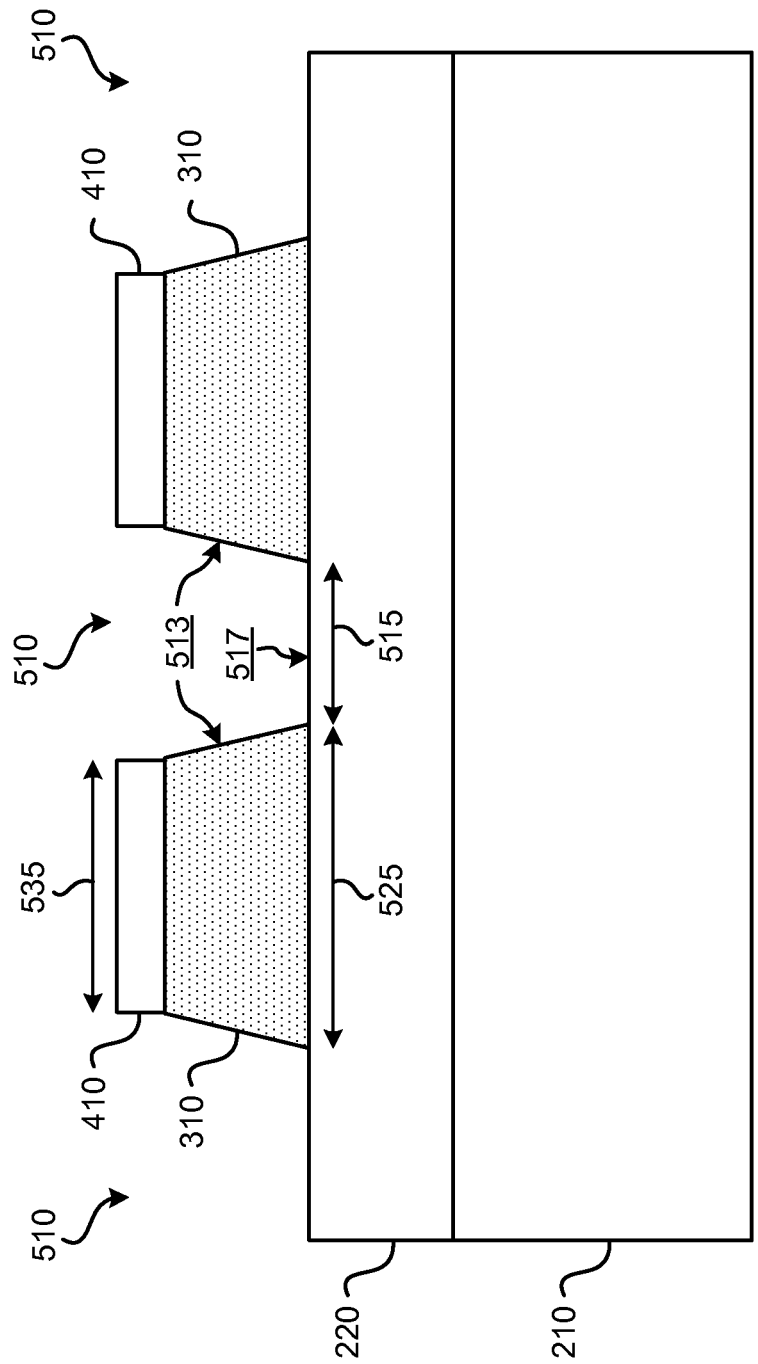

Referring to FIG. 5, portions of the third GaN epitaxial layer 410, and the second GaN epitaxial layer 310 are removed to expose sidewalls 513 of the second GaN epitaxial layer 310 (i.e., sidewall(s) of remaining portions and/or structure(s) of the second GaN epitaxial layer 310) and the top surface 517 of the first GaN epitaxial layer 220. In some embodiments, to help ensure that portions of the second GaN epitaxial layer 310 are fully removed, the removal process may also include removing portions of the first GaN epitaxial layer 220.

The removal of third GaN epitaxial layer 410, and the second GaN epitaxial layer 310 can be performed by an etch or by some other suitable removal process. For example, a controlled etch using an etch mask (not shown but having a width 535 of a remaining portion of the third GaN epitaxial layer 410) can be used, designed to stop at approximately the interface between the second GaN epitaxial layer 310 and the first GaN epitaxial layer 220. Other embodiments may include stopping the etch at other depths, such as after the etch has removed a portion of the first GaN epitaxial layer 220 as mentioned above. Inductively-coupled plasma (ICP) etching and/or other common GaN etching processes can be used.

It can be noted that, in alternative embodiments, the third GaN epitaxial layer 410 and the second GaN epitaxial layer 310 (or, more accurately, one or more structures similar to those formed from the third GaN epitaxial layer 410 and the second GaN epitaxial layer 310 as shown in FIG. 5) may be formed by selective epitaxial regrowth. For example, a masking material that inhibits the epitaxial growth of GaN may be formed and patterned on a surface 517 of the first GaN epitaxial layer 220 prior to the formation of the second GaN epitaxial layer 310 and the third GaN epitaxial layer 410. When these layers 310 and 410 are grown, they will not grow on the masking material (which can include silicon dioxide and/or silicon nitride). The masking material may then be removed, leaving one or more structures similar to those shown in FIG. 5.

Physical dimensions of the resultant structure(s) can vary, depending on desired functionality. In some embodiments, for example, the width 525 of the structure(s) can be between 0.5 μm and 5 μm. Where multiple structures are created, the distance 515 between structures can be between 0.5 μm and 10 μm.

Figure 6:
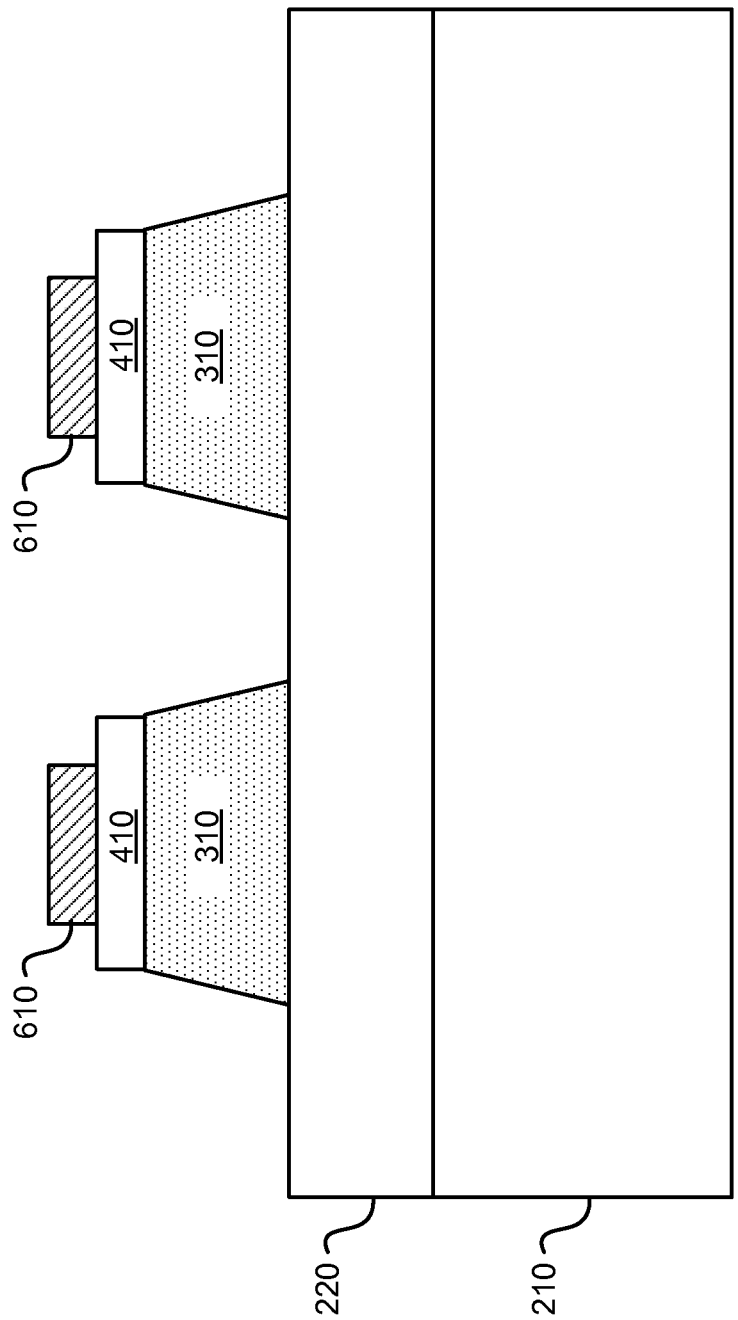

FIG. 6 illustrates how masking material 610 can be formed on remaining portion(s) of the third GaN epitaxial layer 410. In this embodiment, this masking material acts as an inhibitor in a selective epitaxial regrowth process, preventing or reducing the growth of subsequently-formed epitaxial layers on the portion(s) of the third GaN epitaxial layer 410 covered by the masking material 610. As discussed above, masking material can comprise a variety of different materials, such as silicon dioxide, silicon nitride, and/or the like. The masking material 610 is subsequently removed to allow an electrical connection to be made to the remaining portion(s) of the third GaN epitaxial layer 410.

Figure 7:
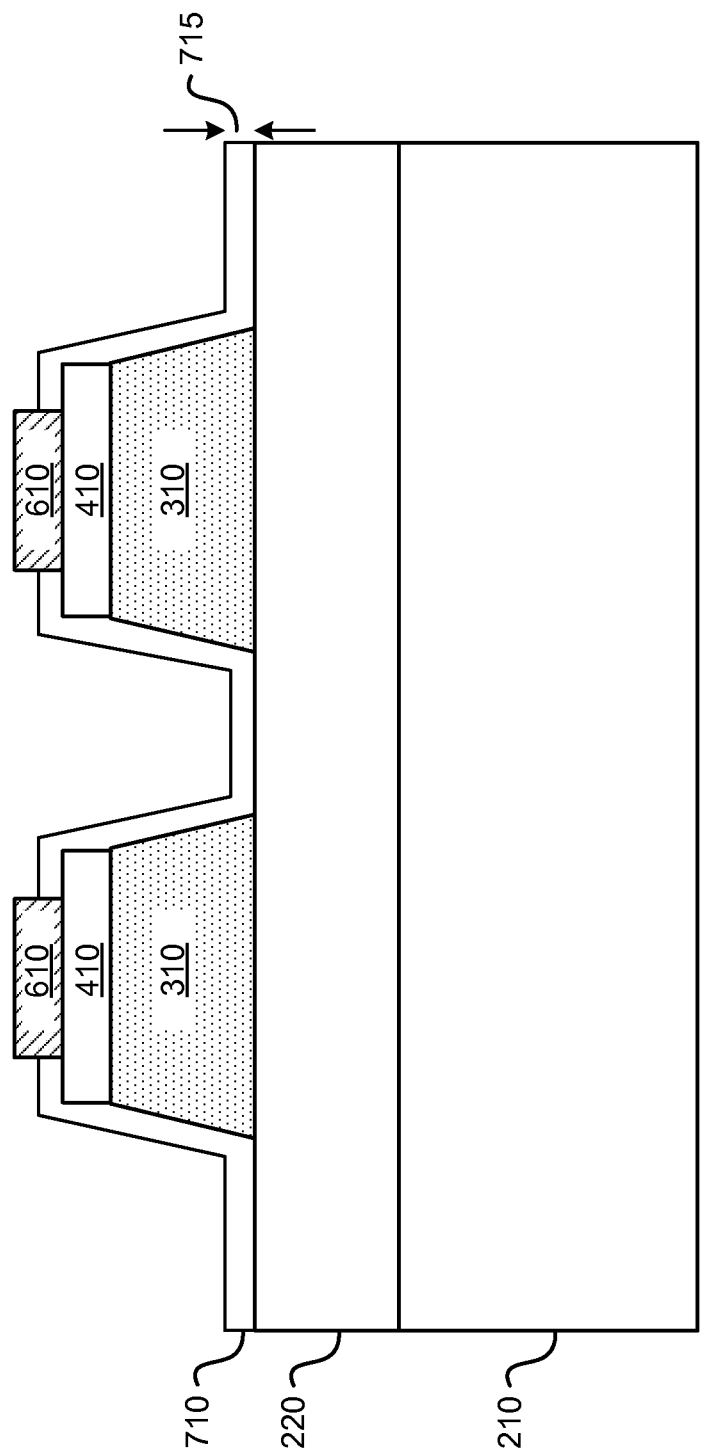
Figure 8:
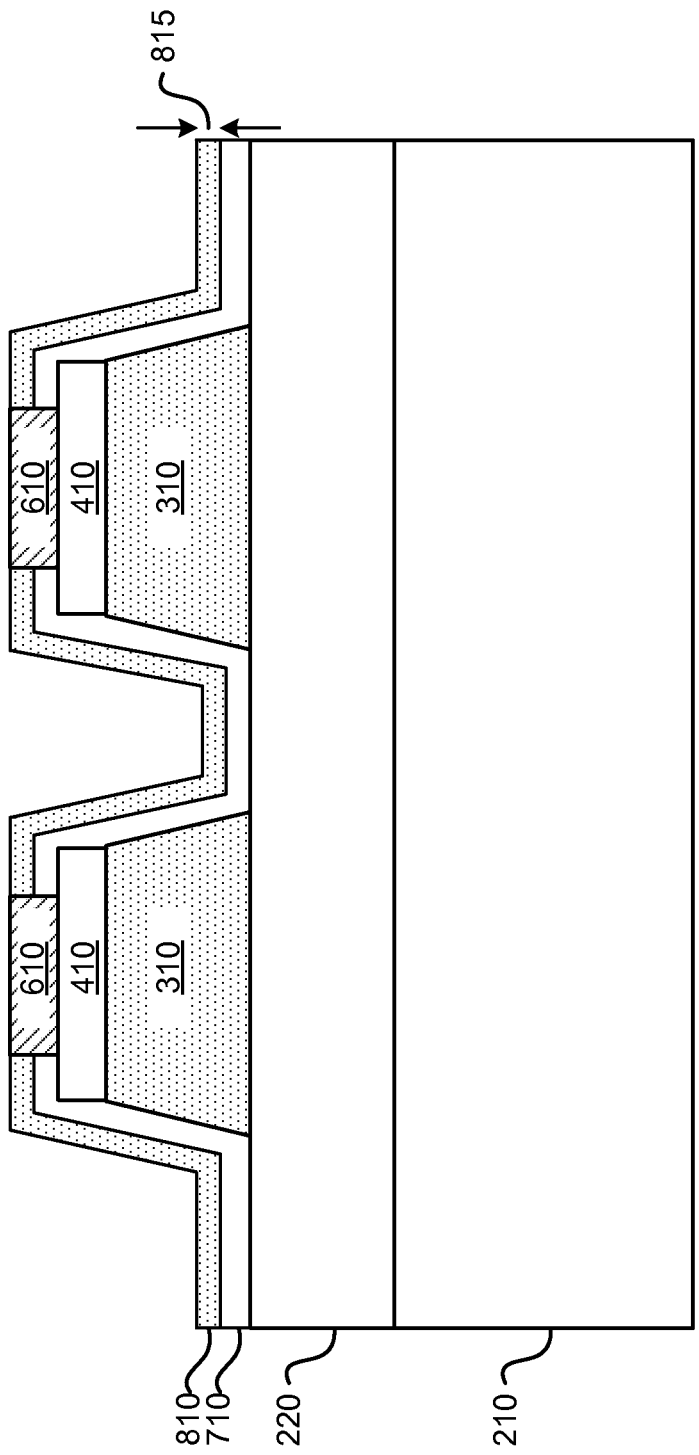

FIGS. 7-8, illustrate a selective regrowth process used to form a fourth GaN epitaxial layer 710 and a fifth GaN epitaxial layer 810. These epitaxial layers 710, 810 are formed across all portions of the exposed surface except the masking material 610, as discussed above. The fourth GaN epitaxial layer 710 can have the same conductivity type as the third GaN epitaxial layer 410 and first GaN epitaxial layer 220, and the fifth GaN epitaxial layer 810 will have an opposite conductivity type. For example, in an embodiment where the fourth GaN epitaxial layer 710 has an n-type conductivity, the fifth GaN epitaxial layer 810 will have a p-type conductivity.

Epitaxial layers 710, 810 are formed such that they are approximately charge-balanced such that together they form a charge-balanced region with approximately no net charge. The thicknesses and doping concentrations of the epitaxial layers 710, 810 therefore may be carefully controlled to form such a charge balance. According to some embodiments, for example, the thickness 715 of a fourth GaN epitaxial layer 710 with an n-type conductivity can be between about 0.1 μm and 1.0 μm, where doping concentrations can be between about $1\times10^{15}$ cm$^{-3}$ to about $5\times10^{18}$ cm$^{-3}$. A corresponding fifth GaN epitaxial layer 810 with an p-type conductivity can have a thickness 815 of between about 0.1 μm and 1.0 μm, with doping concentrations of between about $1\times10^{15}$ cm$^{-3}$ to about $1\times10^{20}$ cm$^{-3}$. The product of thickness and doping concentration of layer 710 and 810 can be closely matched so that these two layers are approximately charge-balanced. One of ordinary skill in the art would recognize many variations, modifications, and alternatives.

Figure 9:
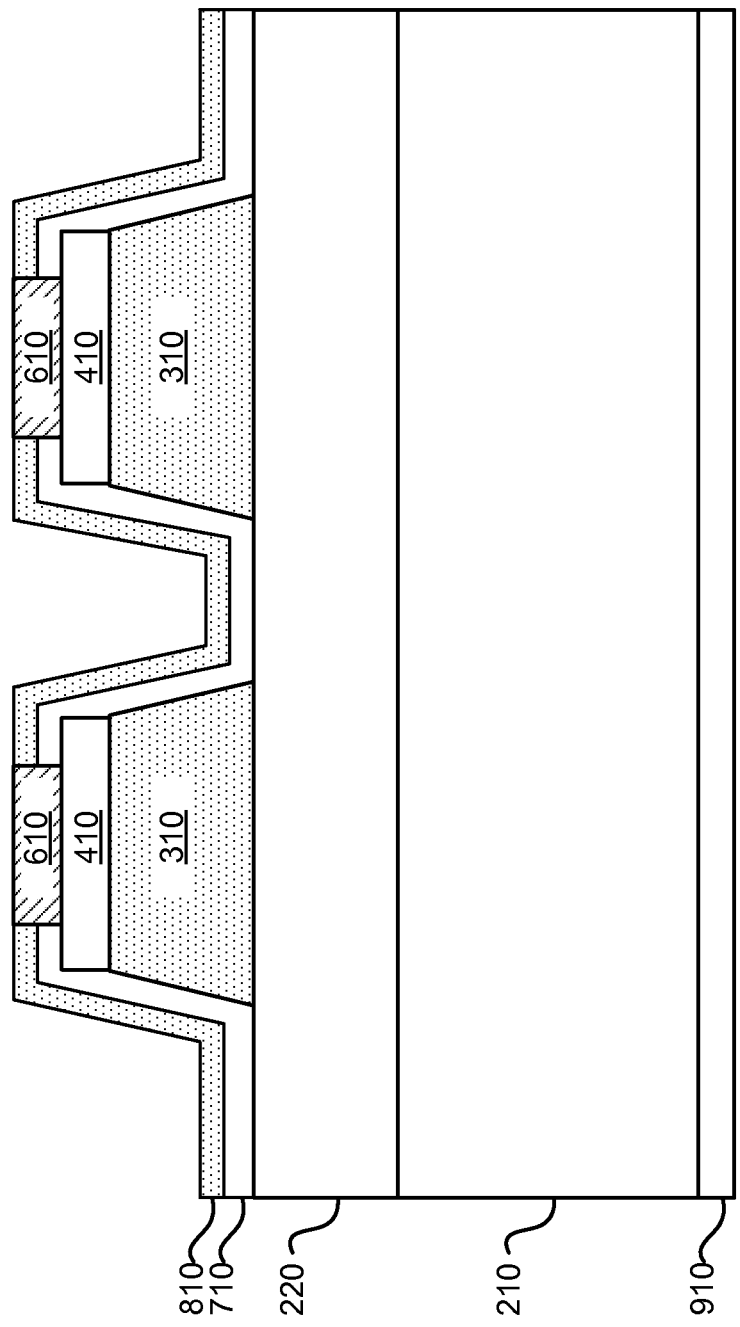

FIG. 9 illustrates the formation of a metal structure 910 below the GaN substrate 210. The metal structure 910 can be one or more layers of Ohmic metal that serve as a substrate contact for the device. For example, the metal structure 910 can comprise a titanium-aluminum (Ti/Al) Ohmic metal. Other metals and/or alloys can be used including, but not limited to, aluminum, nickel, gold, combinations thereof, or the like. In some embodiments, an outermost metal of the first metal structure 910 can include gold, tantalum, tungsten, palladium, silver, or aluminum, combinations thereof, and the like. The first metal structure 910 can be formed using any of a variety of methods such as sputtering, evaporation, or the like.

Figure 10:
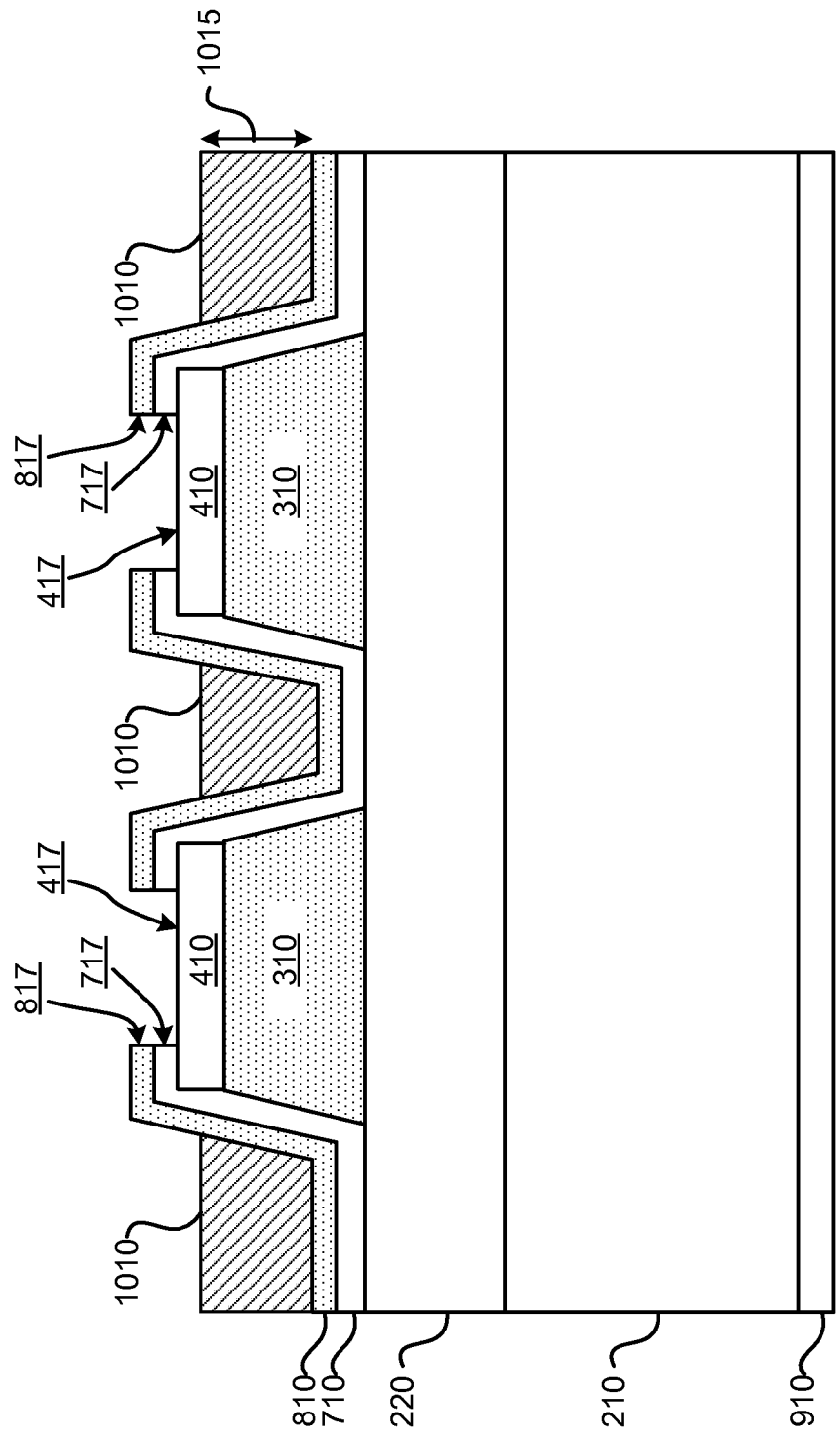

FIG. 10 illustrates removal of the masking material 610 to expose one or more surfaces 417 of remaining portion(s) of the third GaN epitaxial layer 410, one or more surfaces 717 of the fourth GaN epitaxial layer 710, and one or more surfaces 817 of the fifth GaN epitaxial layer 810. The masking material 610 can be removed through etching and/or other removal processes, allowing for subsequent metal formation on the exposed surfaces 417, 717, 817.

FIG. 10 additionally illustrates the formation of one or more insulating structures 1010 coupled to a surface of the fifth GaN epitaxial layer 810. As discussed above, these one or more insulating structures 1010 can insulate at least a portion of the fifth GaN epitaxial layer 810 from a subsequently-formed metal contact layer, enabling the insulated portion of the fifth GaN epitaxial layer 810 and a corresponding portion of the fourth GaN epitaxial layer 710 to for depletion regions when the vertical superjunction diode is in reverse bias. The one or more insulating structures 1010 can comprise, for example, silicon nitride, silicon oxide, and/or other dielectric materials, which can be formed using techniques, such as spin-on coating, and/or planarized through processes such as etching.

The thickness 1015 of the one or more insulating structures 1010 can vary, depending on desired functionality, manufacturing considerations, and other factors. In some embodiments, for example, the thickness 1015 of the one or more insulating structures 1010 is between about 0.1 μm and 50 μm.

Figure 11:
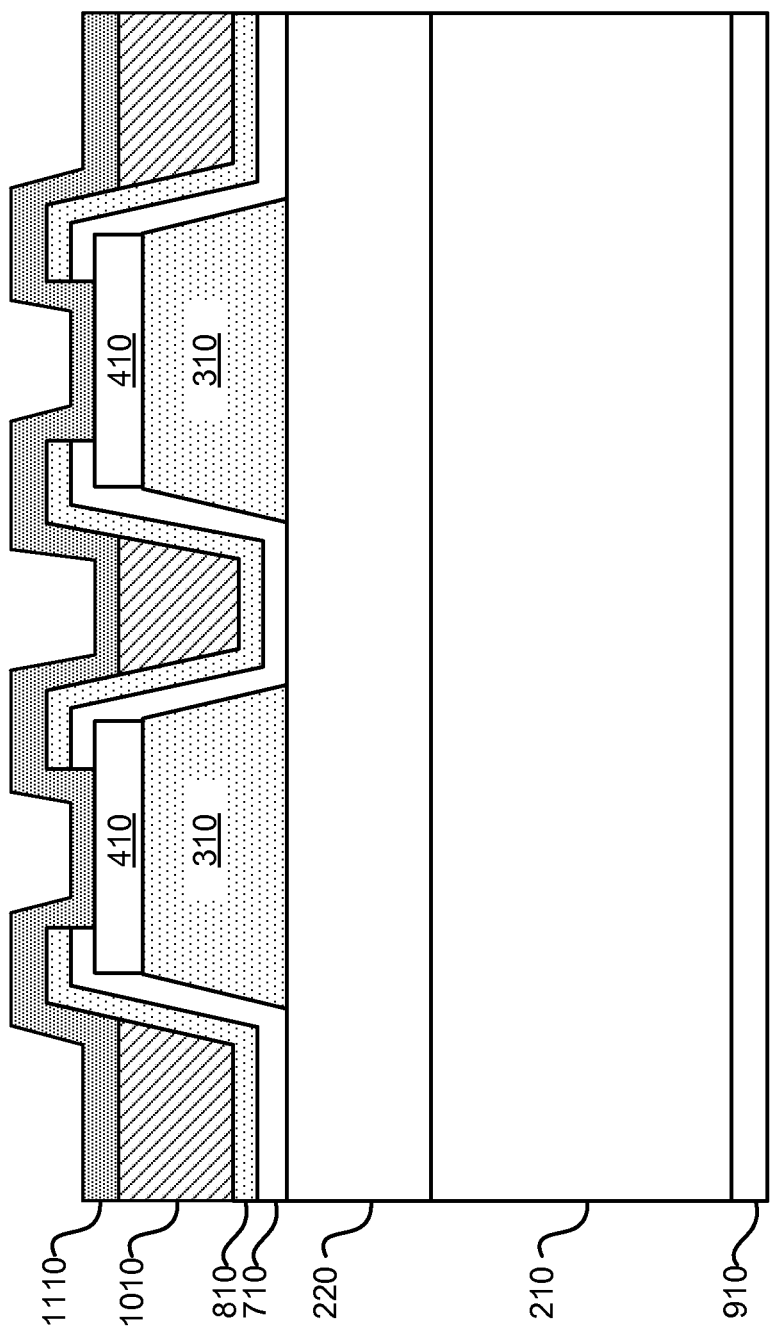

FIG. 11 shows the formation of a metal structure 1110 on the exposed surfaces 417, 717, 817 (shown in FIG. 10) of the GaN epitaxial layers 410, 710, and 810, respectively. The second metal structure 1110 can be one or more layers of metal and/or alloys to create a Schottky barrier with the third GaN epitaxial layer 410, and the second metal structure 1110 also can be formed one at least one surface of the insulating structures 1010 and at least one surface of the fifth GaN epitaxial layer 810 to create Ohmic contact to layer 810. The second metal structure 1110 can be formed using a variety of techniques, including lift-off and/or deposition with subsequent etching, which can vary depending on the metals used. In some embodiments, the second metal structure 1110 can include nickel, platinum, palladium, silver, gold, and the like. In alternative embodiments where, for example, low turn-on voltage may be desired, the second metal structure 1110 may be configured to create an ohmic contact with the third GaN epitaxial layer 410.

The process shown in FIGS. 2-11 are provided as an example only, and are not limiting. In some embodiments, masking material 610 step in FIG. 6 is not used (not shown). The fourth and fifth GaN epitaxial layers 710 and 810 are formed uniformly and then partially removed at locations of masking materials 610 to expose the third epitaxial layer 410 for metal contact. Furthermore, the figures are not drawn to scale, and the manufacture of the vertical superjunction diodes can include additional steps and/or features that are not shown. Moreover, it can be noted that, although the embodiment described in process shown in FIGS. 2-11 discussed GaN materials, other III-nitride materials may be used additionally or alternatively. The layers and/or structures described herein may include a number of sublayers, substructures, and/or other components to provide the functionality described herein. One of ordinary skill in the art would recognize many variations, modifications, and alternatives.

Figure 12:
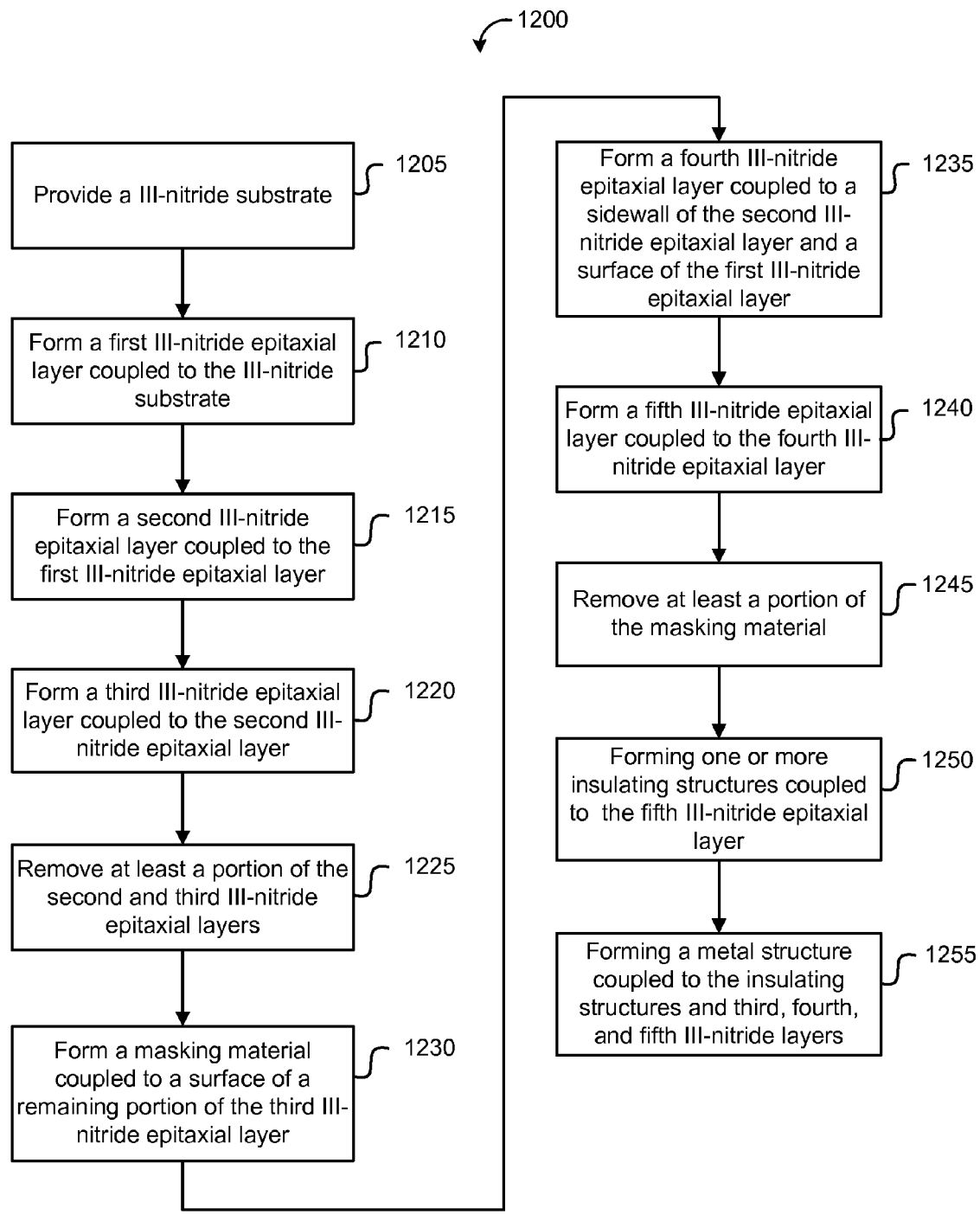
FIG. 12 is a flowchart illustrating a method of fabricating a vertical superjunction diode according to one embodiment.

FIG. 12 is a flowchart illustrating a method 1200 of fabricating a vertical superjunction diodes, according to an embodiment of the present invention. The method 1200 can begin by providing a III-nitride substrate (1205) which is of a first conductivity type. In an embodiment, the III-nitride is an n-type GaN substrate. A first III-nitride epitaxial layer coupled to the III-nitride substrate is then formed (1210), where the first III-nitride epitaxial layer is of the first conductivity type. As indicated above, the first III-nitride epitaxial layer can have a lower doping concentration than the III-nitride substrate.

A second III-nitride epitaxial layer coupled to the first III-nitride epitaxial layer is then formed (1215). As discussed above, the second III-nitride layer can comprise an intrinsic layer and/or a low-doped layer having the opposite conductivity as the first III-nitride epitaxial layer. In one embodiment, for example, the second III-nitride layer is a low-doped epitaxial layer with p-type conductivity.

A third III-nitride epitaxial layer of the first conductivity type coupled to the second III-nitride epitaxial layer is formed (1220), and then a portion of the third III-nitride epitaxial layer and a portion of the second III-nitride epitaxial layer are removed (1225) to expose a sidewall of the second III-nitride epitaxial layer and a surface of the first III-nitride epitaxial layer. A masking material coupled to a surface of a remaining portion of the third III-nitride epitaxial layer is formed (1230). The masking material can be comprised of one or more materials that inhibit the formation of an epitaxial layer in an epitaxial regrowth process.

A fourth III-nitride epitaxial layer is formed, coupled to the sidewall of the second III-nitride epitaxial layer and the exposed surface of the first III-nitride epitaxial layer (1235). A fifth III-nitride epitaxial layer coupled to the fourth III-nitride epitaxial layer is then formed (1240). The fourth III-nitride epitaxial layer and the fifth III-nitride epitaxial layer can be of the first and second conductivity types, respectively, and configured to be approximately charged balanced.

At least a portion of the masking material is removed (1245) which can expose the surface of a remaining portion of the third III-nitride epitaxial layer, a surface of the fourth III-nitride epitaxial layer, and a surface of the fifth III-nitride epitaxial layer. One or more insulating structures coupled to the fifth III-nitride epitaxial layer is then formed (1250). Finally, the method 1200 includes forming a metal structure coupled to the insulating structures and exposed surfaces of the third, fourth, and fifth III-nitride epitaxial layers (1255). Among other things, the metal structure forms an electrical connection with one terminal of the vertical superjunction diode.

It should be appreciated that the specific steps illustrated in FIG. 12 provide a particular method of fabricating a vertical superjunction diode according to an embodiment of the present invention. Other sequences of steps may also be performed according to alternative embodiments. For example, alternative embodiments of the present invention may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 13:
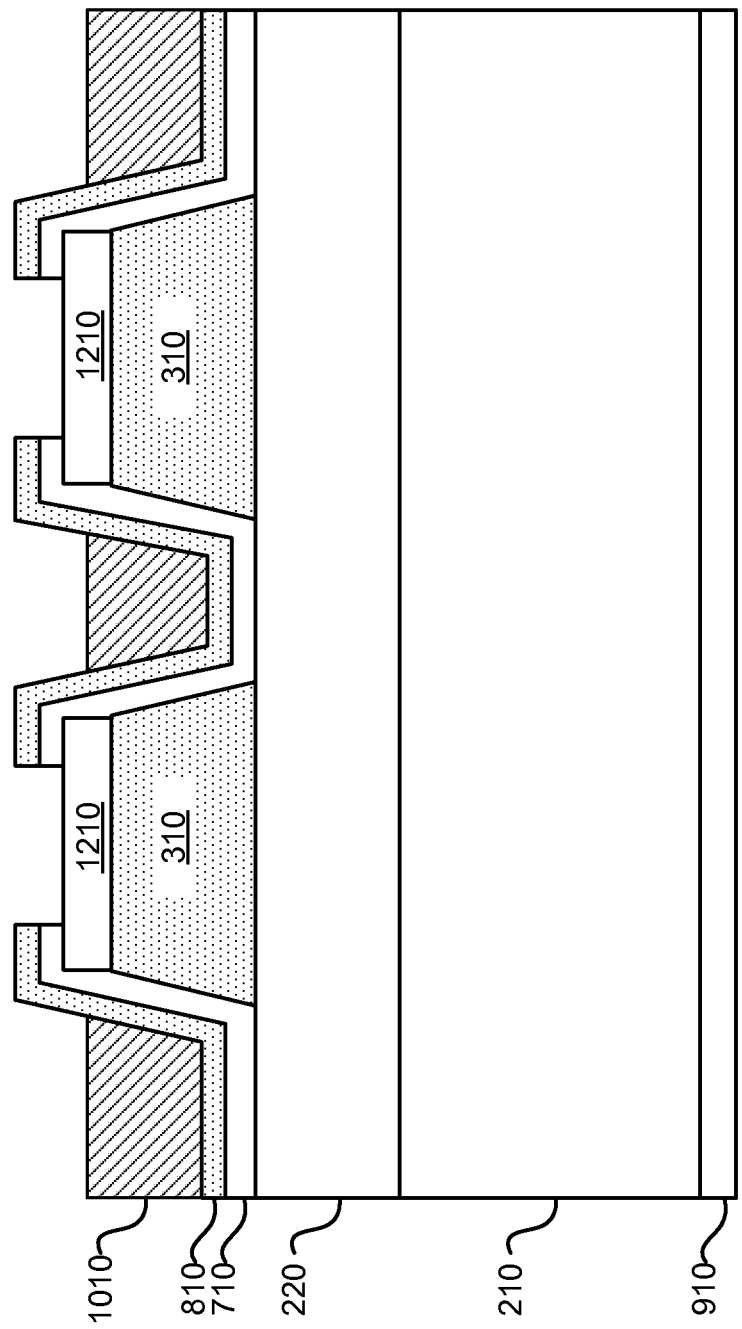
FIGS. 13-15 are simplified cross-sectional diagrams illustrating the fabrication of a vertical superjunction junction field-effect transistor (JFET) according to another embodiment of the present invention.
Figure 14:
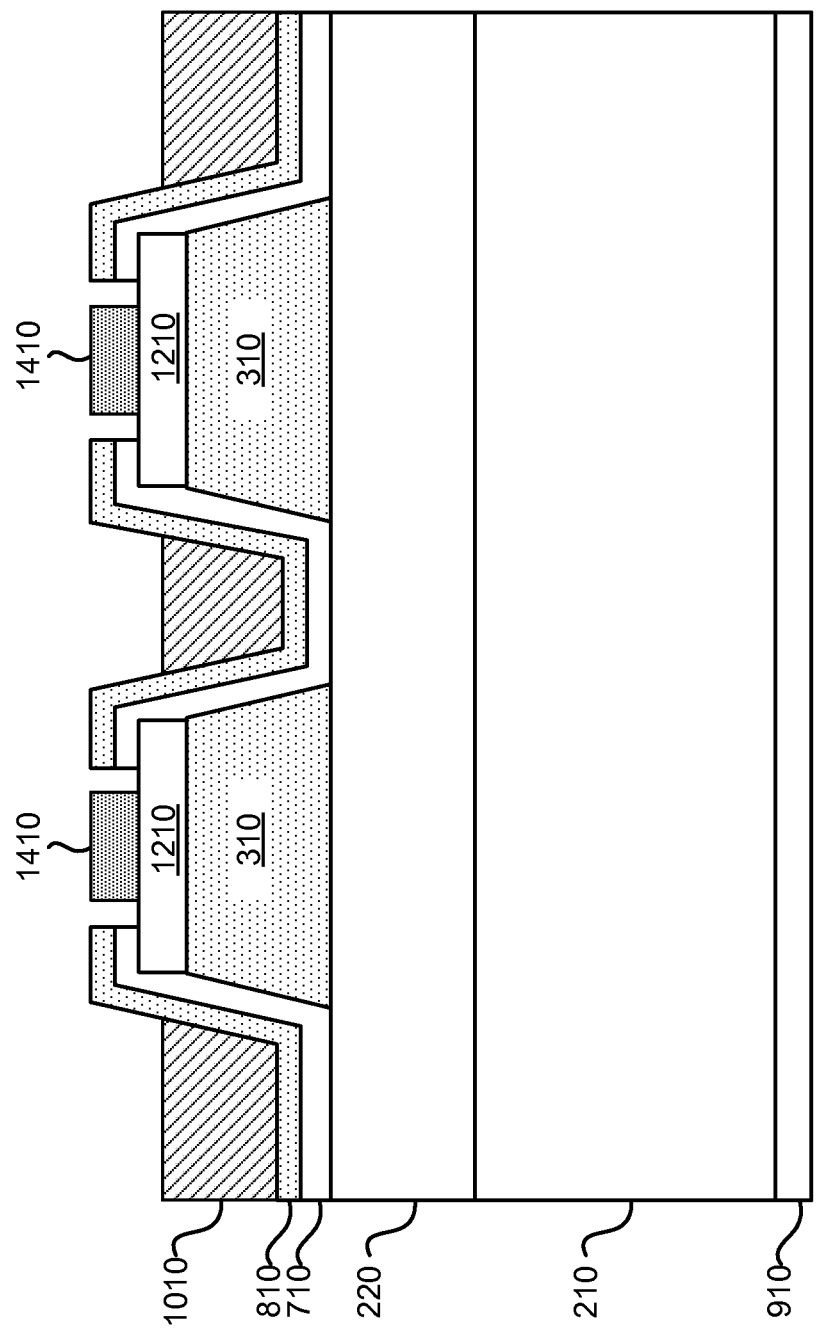
Figure 15:
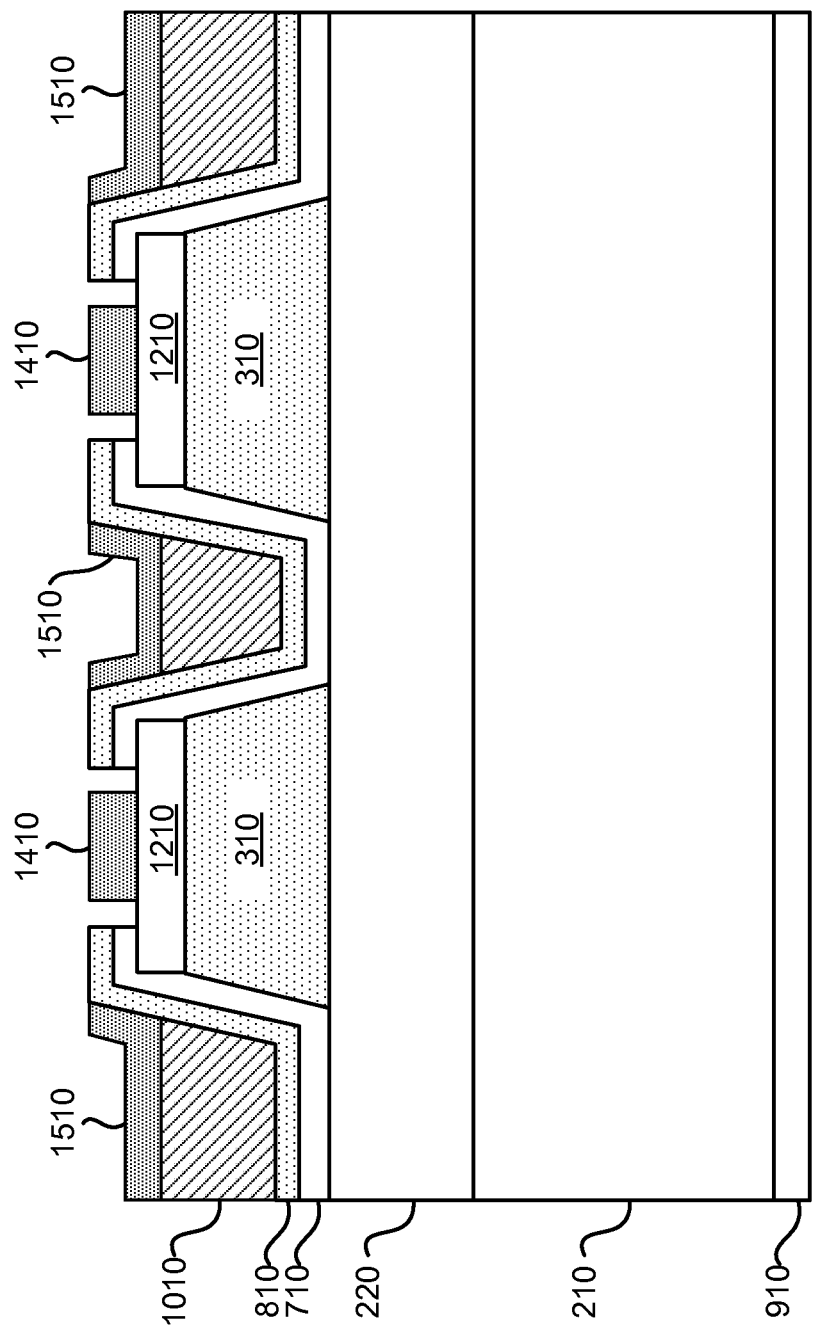

FIGS. 13-15 are simplified cross-sectional diagrams illustrating a particular embodiment of a process for creating a vertical superjunction junction field-effect transistor (JFET). Although the figures include more than one vertical superjunction JFET, the process described can refer to the manufacture of a single and/or isolated vertical superjunction JFET. Referring to FIG. 13, a GaN substrate 210, a first GaN epitaxial layer 220, a second GaN epitaxial layer 310, epitaxial layers 710, 810, insulating structures 1010, and metal structure 910 are provided in a process similar to that described in relation to FIGS. 2-10. Furthermore, physical characteristics (e.g., thicknesses, dopant concentrations, etc.) of the layers can be similar to those in the corresponding layers of FIG. 10. Here, however, a third GaN epitaxial layer 1310 can comprise a more heavily-doped epitaxial layer than the corresponding third GaN epitaxial layer 410 of FIG. 10, allowing the third GaN epitaxial layer 1310 in this process to be formed into one or more source regions for the vertical superjunction JFET. In some embodiments, for example, the third GaN epitaxial layer 1310 has n+ conductivity, with a doping concentration between about $1 \times 10^{18}$ cm$^{-3}$ to about $1 \times 10^{19}$ cm$^{-3}$.

FIG. 14 illustrates the formation of the source contacts 1410 of the vertical superjunction JFET. The source contacts 1410 can comprise one or more metal structures, each having one or more layers of ohmic metal that serve to provide electrical connectivity to the source of the vertical superjunction JFET. For example, the source contacts 1410 can comprise a titanium-aluminum (Ti/Al) ohmic metal. Other metals and/or alloys can be used including, but not limited to, aluminum, nickel, gold, combinations thereof, or the like. In some embodiments, an outermost metal of the first source contacts 1410 can include gold, tantalum, tungsten, titanium, palladium, silver, or aluminum, combinations thereof, and the like. The source contacts 1410 can be formed using any of a variety of methods such as sputtering, evaporation, and the like, which may be patterned using photolithographic patterning, removal (e.g., etch), and/or other patterning techniques.

Figure 16:
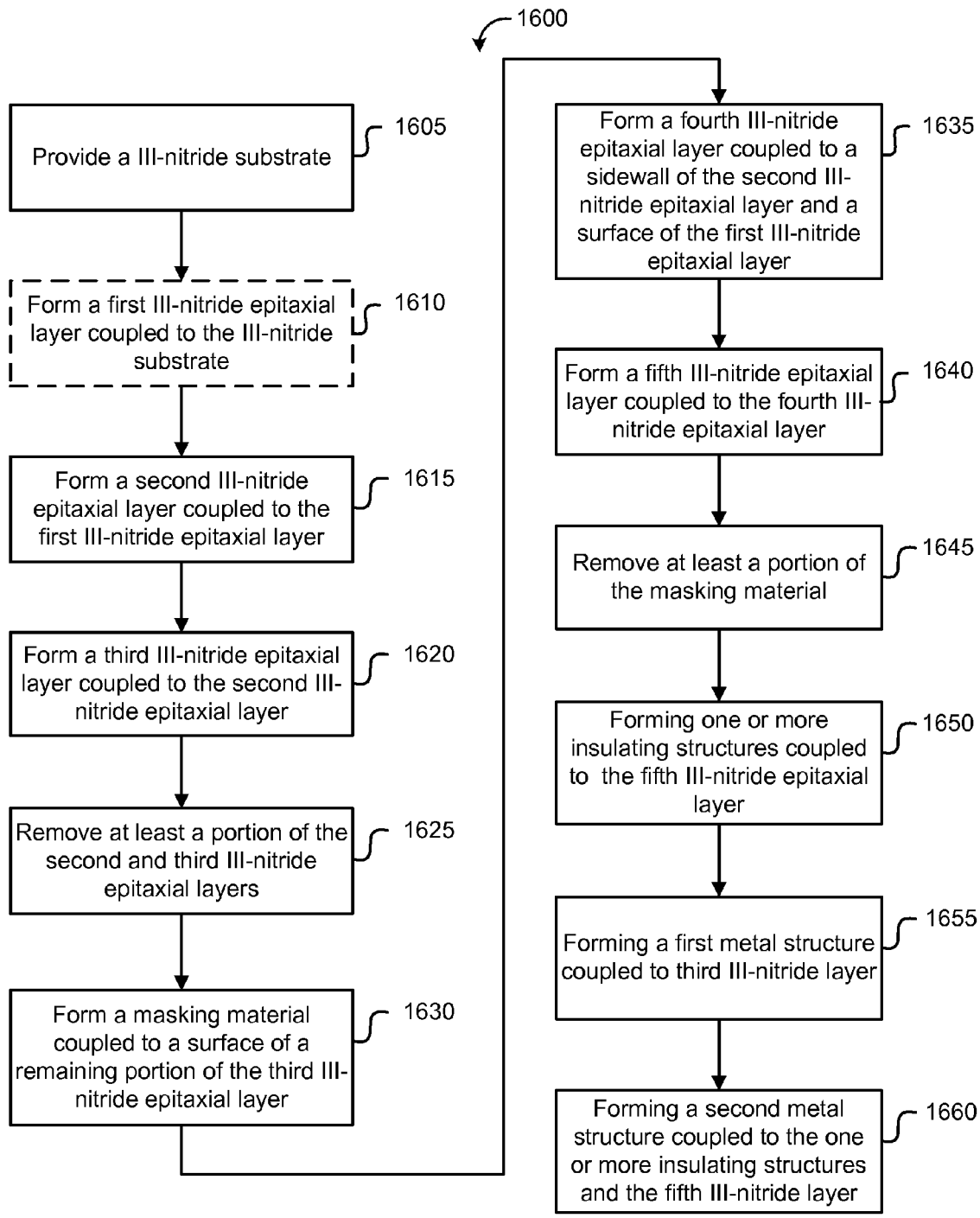
FIG. 16 is a simplified flowchart illustrating a method of fabricating a vertical superjunction JFET according to another embodiment of the present invention.

FIG. 16 is a flowchart illustrating a method 1600 of fabricating a vertical superjunction JFET, according to an embodiment of the present invention. The method 1600 can begin by providing a III-nitride substrate (1605) which is of a first conductivity type. In an embodiment, the III-nitride is an n-type GaN substrate. Optionally, a first III-nitride epitaxial layer coupled to the III-nitride substrate is then formed (1610), where the first III-nitride epitaxial layer is of the first conductivity type. As indicated above, the first III-nitride epitaxial layer can have a lower doping concentration than the III-nitride substrate.

A second III-nitride epitaxial layer coupled to the first III-nitride epitaxial layer is then formed (1615). As discussed above, the second III-nitride layer can comprise an intrinsic layer and/or a low-doped layer having the opposite conductivity as the first III-nitride epitaxial layer. In one embodiment, for example, the second III-nitride layer is a low-doped epitaxial layer with p-type conductivity.

A third III-nitride epitaxial layer of the first conductivity type coupled to the second III-nitride epitaxial layer is formed (1620), and then a portion of the third III-nitride epitaxial layer and a portion of the second III-nitride epitaxial layer are removed (1625) to expose a sidewall of the second III-nitride epitaxial layer and a surface of the first III-nitride epitaxial layer. The third III-nitride epitaxial layer can have a relatively high doping concentration in relation to the first III-nitride epitaxial layer. A masking material coupled to a surface of a remaining portion of the third III-nitride epitaxial layer is formed (1630). The masking material can be comprised of one or more materials that inhibit the formation of an epitaxial layer in an epitaxial regrowth process.

A fourth III-nitride epitaxial layer is formed, coupled to the sidewall of the second III-nitride epitaxial layer and the exposed surface of the first III-nitride epitaxial layer (1635). A fifth III-nitride epitaxial layer coupled to the fourth III-nitride epitaxial layer is then formed (1640). The fourth III-nitride epitaxial layer and the fifth III-nitride epitaxial layer can be of the first and second conductivity types, respectively, and configured to be approximately charged balanced.

At least a portion of the masking material is removed (1645) which can expose the surface of a remaining portion of the third III-nitride epitaxial layer, a surface of the fourth III-nitride epitaxial layer, and a surface of the fifth III-nitride epitaxial layer. One or more insulating structures coupled to the fifth III-nitride epitaxial layer is then formed (1650).

The method 1600 includes forming a first metal structure coupled to the third III-nitride epitaxial layers (1655) to provide an electrical contact to the source of the vertical superjunction JFET. A second metal structure 1510 is formed, coupled to at least one surface of the one or more insulating structures, and a surface of the fifth III-nitride epitaxial layer (1660). The second metal structure 1510 provides an electrical contact to the gate of the vertical superjunction JFET.

It should be appreciated that the specific steps illustrated in FIG. 16 provide a particular method of fabricating a vertical superjunction diode according to an embodiment of the present invention. Other sequences of steps may also be performed according to alternative embodiments. For example, alternative embodiments of the present invention may perform the steps outlined above in a different order. Moreover, the individual steps illustrated in FIG. 16 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 17:
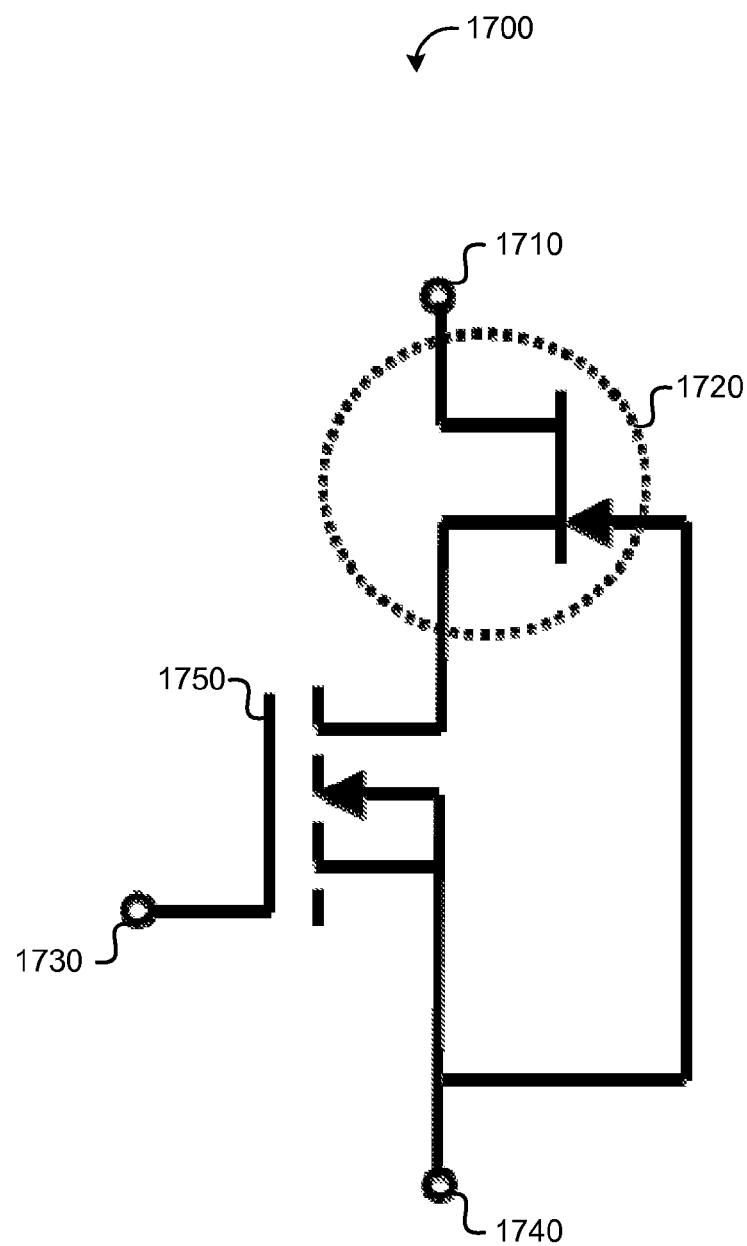
FIG. 17 is a schematic drawing illustrating a simplified circuit implementation of a vertical superjunction JFET.

FIG. 17 is a schematic drawing illustrating a simple circuit implementation 1700 of a vertical superjunction JFET, such as those described in relation to FIGS. 13-17. The implementation 1700 is a cascode circuit where a low-voltage, high-current MOSFET 1750 is provided in series with a high voltage GaN superjunction JFET 1720. When voltage at the gate 1730 of the MOSFET 1750 causes the MOSFET 1750 to switch off, the voltage across the drain and source of the MOSFET 1750 rises, and applying a negative bias to the gate of the GaN superjunction JFET 1720. This causes the GaN superjunction JFET 1720 to switch off as well, blocking the whole applied voltage to the cascode circuit. As such, the cascode circuit can be implemented similar to a single transistor with gate 1730, source 1740, and drain 1710 connections.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a vertical superjunction device, the method comprising:
    providing a III-nitride substrate of a first conductivity type;
    forming a first III-nitride epitaxial layer of the first conductivity type coupled to the III-nitride substrate;
    forming a second III-nitride epitaxial layer coupled to the first III-nitride epitaxial layer;
    forming a third III-nitride epitaxial layer of the first conductivity type coupled to the second III-nitride epitaxial layer;
    removing a portion of the third III-nitride epitaxial layer and a portion of the second III-nitride epitaxial layer to expose a sidewall of the second III-nitride epitaxial layer and an exposed surface of the first III-nitride epitaxial layer;
    forming a masking material coupled to a surface of a remaining portion of the third III-nitride epitaxial layer;
    forming a fourth III-nitride epitaxial layer of the first conductivity type coupled to the sidewall of the second III-nitride epitaxial layer and the exposed surface of the first III-nitride epitaxial layer;
    forming a fifth III-nitride epitaxial layer of a second conductivity type coupled to the fourth III-nitride epitaxial layer;
    removing at least a portion of the masking material to expose:
        the surface of the remaining portion of the third III-nitride epitaxial layer,
        a surface of the fourth III-nitride epitaxial layer, and
        a surface of the fifth III-nitride epitaxial layer; and
    forming one or more insulating structures coupled to the fifth III-nitride epitaxial layer.

2. The method of claim 1 further comprising forming a metal structure coupled to:
    at least one of the one or more insulating structures;
    the exposed surface of the remaining portion of the third III-nitride epitaxial layer;
    the exposed surface of the fourth III-nitride epitaxial layer; and
    the exposed surface of the fifth III-nitride epitaxial layer.

3. The method of claim 1 wherein forming at least one of the fourth III-nitride epitaxial layer or the fifth III-nitride epitaxial layer comprises an epitaxial regrowth process.

4. The method of claim 1 further comprising forming a metal structure coupled to the III-nitride substrate, wherein the metal structure forms an ohmic electrical contact with the III-nitride substrate.

5. The method of claim 1 wherein the second III-nitride epitaxial layer is of the second conductivity type.

6. The method of claim 1 wherein the second III-nitride epitaxial layer has intrinsic conductivity.

7. The method of claim 1 further comprising:
    forming a first metal structure coupled to the exposed surface of the remaining portion of the third III-nitride epitaxial layer, wherein the first metal structure forms a first ohmic contact with the exposed surface of the remaining portion of the third III-nitride epitaxial layer; and forming a second metal structure coupled to:
at least one of the one or more insulating structures; and
the fifth III-nitride epitaxial layer, wherein the second metal structure forms a second ohmic contact with the surface of the fifth III-nitride epitaxial layer.

8. The method of claim 1 wherein the fourth III-nitride epitaxial layer and the fifth III-nitride epitaxial layer are substantially charge balanced.

9. The method of claim 1 wherein the first conductivity type is n-type having a dopant including at least one of silicon or oxygen.

* * * * *